(12) United States Patent
Shambat et al.

(10) Patent No.: US 8,829,638 B2
(45) Date of Patent: *Sep. 9, 2014

(54) ULTRAFAST PHOTONIC CRYSTAL CAVITY SINGLE-MODE LIGHT-EMITTING DIODE

(71) Applicant: The Board of Trutees of the Leland Stanford Junior University, Palo Alto, CA (US)

(72) Inventors: Gary Shambat, Menlo Park, CA (US); Bryan Ellis, Sunyvale, CA (US); Jelena Vuckovic, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/678,393

(22) Filed: Nov. 15, 2012

(65) Prior Publication Data

US 2013/0092897 A1   Apr. 18, 2013

Related U.S. Application Data

(63) Continuation-in-part of application No. 13/066,048, filed on Apr. 5, 2011.

(60) Provisional application No. 61/341,881, filed on Apr. 5, 2010.

(51) Int. Cl.
*H01L 31/102* (2006.01)

(52) U.S. Cl.
USPC .... 257/458; 257/432; 257/656; 257/E33.046; 385/14; 385/131

(58) Field of Classification Search
USPC ............... 257/432, 458, 656, 98, E33.046; 385/14, 125, 131; 372/92
See application file for complete search history.

(56) References Cited

U.S. PATENT DOCUMENTS

| 7,603,016 | B1 * | 10/2009 | Soref | 385/129 |
| 2011/0248242 | A1 * | 10/2011 | Ellis et al. | 257/23 |
| 2011/0305456 | A1 * | 12/2011 | Sharkawy et al. | 398/45 |
| 2011/0305465 | A1 * | 12/2011 | Mimura | 399/12 |

* cited by examiner

*Primary Examiner* — Jose R Diaz
(74) *Attorney, Agent, or Firm* — Lumen Patent Firm

(57) ABSTRACT

Electrical pumping of photonic crystal (PC) nanocavities using a lateral p-i-n junction is described. Ion implantation doping can be used to form the junction, which under forward bias pumps a gallium arsenide photonic crystal nanocavity with indium arsenide quantum dots. Efficient cavity-coupled electroluminescence is demonstrated in a first experimental device. Electrically pumped lasing is demonstrated in a second experimental device. High speed modulation of a single mode LED is demonstrated in a third experimental device. This approach provides several significant advantages. Ease of fabrication is improved because difficult timed etch steps are not required. Any kind of PC design can be employed. Current flow can be lithographically controlled to focus current flow to the active region of the device, thereby improving efficiency, reducing resistance, improving speed, and reducing threshold. Insulating substrates can be employed, which facilitates inclusion of these devices in photonic integrated circuits.

15 Claims, 15 Drawing Sheets

ULTRAFAST PHOTONIC CRYSTAL CAVITY SINGLE-MODE LIGHT-EMITTING DIODE

CROSS REFERENCE TO RELATED APPLICATIONS

This application is a continuation in part of U.S. application Ser. No. 13/066,048, filed Apr. 5, 2011, entitled "A Practical Electrically Pumped Photonic Crystal Nanocavity", and hereby incorporated by reference in its entirety. Application Ser. No. 13/066,048 claims the benefit of U.S. provisional patent application 61/341,881, filed on Apr. 5, 2010, entitled "Practical Electrically Pumped Photonic Crystal Nanocavity", and hereby incorporated by reference in its entirety.

GOVERNMENT SPONSORSHIP

This invention was made with Government support under contract number FA9550-09-1-0704 awarded by the Air Force Office of Scientific Research. The Government has certain rights in this invention.

BACKGROUND

Optical interconnects have been proposed as a replacement for electrical interconnects because the loss in electrical wires at high frequencies is becoming a major limitation in information processing devices. To be practical, optical interconnects must therefore consume very little power. For example, one study found that in order for an on-chip optical interconnect to be useful, the entire optical link must consume less than 10 fJ/bit. Semiconductor nanocavity lasers are promising optical sources for this application because they consume little power due to the small active volume and the Purcell effect threshold reduction. The optically pumped photonic crystal (PC) nanocavity laser has been extensively studied because it has been shown to have nanowatt thresholds and high speed modulation rates. In addition, it has been demonstrated that it can operate in continuous wave mode at room temperature, and can be easily integrated with passive elements, such as PC waveguides, making them promising for optoelectronic integrated circuits. However, in order for them to be practical, electrical pumping techniques must be developed.

The main challenge of electrically pumping PC membrane nanocavities is how to efficiently inject current into the cavity region. A vertical p-i-n junction in the membrane has been used to electrically pump GaAs PC cavities and to demonstrate reduction of emission rate for cavity coupled electroluminescence (EL). However, due to the limited current spreading ability of the thin conductive layers, most of the electroluminescence is not coupled to the cavity. A PC nanocavity can be efficiently pumped by using a central current post, and lasing has been demonstrated using this technique (Park et al., Science v305 n5689 pp 1444-1447, 2004). One disadvantage of the approach of Park et al. is that the fabrication is complicated, requiring a precisely timed undercut step, and an arbitrary PC design cannot be used since the size and position of the PC holes determine the current post size. In addition, the lasers had a high threshold compared to other electrically pumped microcavity lasers such as micropillars, suggesting that the PC lasers suffered from undesirable leakage current. Thus, practical electrical pumping of PC semiconductor devices has not yet been demonstrated.

One example of PC nanocavities in the art is the work of Tanabe et al., (e.g., as described in Applied Physics Letters v96, pp 101103-1 to 101103-3 and in Optics Express v17n25, pp 22505-22513) relating to PC photodetectors and modulators. Other examples of PC nanocavities in the art include U.S. Pat. No. 5,784,400, U.S. Pat. No. 7,079,240 and U.S. Pat. No. 7,492,979, where lasing in such nanocavities is considered. However, as indicated above, electrical pumping of PC nanocavities is difficult, and none of these patent references demonstrate electrical pumping of a PC laser.

SUMMARY

To address this issue, a technique to electrically pump photonic crystal nanocavities using a lateral p-i-n junction is described. In two examples described below, ion implantation doping is used to form the junction, which under forward bias pumps a gallium arsenide photonic crystal nanocavity with indium arsenide quantum dots. Efficient cavity-coupled electroluminescence is demonstrated in a first experimental device. Electrically pumped lasing is demonstrated in a second experimental device.

A lateral p-i-n junction presents a solution to the above-described problem since the current flow can be defined lithographically and therefore is compatible with arbitrary photonic crystal designs. Ion implantation is a standard method of doping in the electronics industry, and can also be used to dope III-V materials with a lateral junction on a sub-micron scale. Previous studies of edge-emitting lateral current injection lasers found that the performance was worse than in comparable vertical injection lasers due to a nonuniform carrier distribution in the active region. This is because the lasers were fabricated with intrinsic regions wider than the ambipolar diffusion length, which in most III-V materials is approximately 1 µm. Improvements in fabrication techniques should allow the intrinsic region width to be reduced significantly, leading to better performance.

This approach provides several significant advantages. Ease of fabrication is improved because difficult timed etch steps are not required. Any kind of PC design can be employed. Current flow can be lithographically controlled to focus current flow to the active region of the device, thereby improving efficiency, reducing resistance, improving speed, and reducing threshold. Insulating substrates can be employed, which facilitates inclusion of these devices in photonic integrated circuits.

FIG. 1e shows a top view of an exemplary embodiment of the invention. In this example, a semiconductor layer 108 is a direct gap material (e.g., GaAs, InP, InGaAs, etc.). An optical resonator 132 is disposed in layer 108, and has its lateral confinement (i.e., confinement in the plane of layer 108) provided by a photonic crystal structure 124. In this example, the photonic crystal structure is an array of holes substantially on a hexagonal lattice, as shown. A lateral P-I-N structure is also present in layer 108. More specifically, region 114 is an n-type region, region 116 is a p-type region, and region 130 is an intrinsic region. Optical resonator 132 is included in intrinsic region 130 and is adjacent to n-type region 114 and to p-type region 116.

Preferably, intrinsic region 130 includes a focus zone 134 having width substantially less than other zones of the intrinsic region, and has optical resonator 132 disposed in this focus zone, as shown on FIG. 1e. Here, the term "width" refers to the lateral separation between the p-type and n-type regions provided by intrinsic region 130 (i.e., "width" is the vertical dimension on FIG. 1e). More preferably, focus zone 134 has a width of ¼ or less of a nominal width of other zones of the intrinsic region (e.g., the width of zone 136). This geometry for the intrinsic region provides lateral current confinement, such that current flow between the p-type and n-type regions primarily occurs through focus zone 134 of intrinsic region 130. In more physical terms, it is preferred for the width of focus zone 134 to be less than the ambipolar diffusion length in the material of layer 108, and for the width of other zones of intrinsic region 130 to be greater than this ambipolar diffusion length. It is also preferred for the lateral dimensions of focus zone 134 to be substantially the same as the lateral dimensions of optical resonator 132 (e.g., as shown on FIG. 1e).

The optical resonator can be any type of optical resonator having photonic crystal lateral confinement. In the example of FIG. 1e, the optical resonator is formed by a defect including one or more linearly adjacent missing holes of the photonic crystal array. In this example, the defect is referred to as an L3 defect because 3 adjacent holes are missing. The defect that forms the optical resonator can also include holes having their positions shifted from nominal lattice positions. Missing and/or shifted holes can be used in any combination to form the optical resonator. For example, holes near the missing holes of an L3 defect can be shifted to improve cavity quality factor (e.g., as described in greater detail in articles by Akahane et al. (Nature 425, 944-947 2004) and Ellis et al. (APL 90, 151102 2007), both of which are incorporated by reference in their entirety).

Optical resonator 132 can include quantum wells, quantum wires, and/or quantum dots to improve device performance (e.g., by increasing optical gain). Such inclusions can be provided by including them in semiconductor layer 108 using any suitable fabrication approach, such as molecular beam epitaxy, chemical vapor deposition, atomic layer deposition, and vapor phase epitaxy.

Photonic crystal structure 124 can include one or more waveguides to provide in-plane optical coupling to resonator 132. Such waveguides can have any design that is compatible with the photonic crystal structure. For example, extended linear defects in the photonic crystal structure can be used to form waveguides.

These lateral P-I-N structures can be applied to several kinds of optoelectronic devices. A laser having such a structure may provide a practical approach for electrical pumping of photonic crystal lasers. A modulator having such a structure may provide efficient injection of carriers to provide modulation (e.g. due to the refractive index shift provided by injected carriers). A detector having such a structure may provide efficient transport of photo-generated carriers from the resonator to contacts at the p-type and n-type regions. There are also many other applications of this structure. For example, light emitting diodes, electrically driven PC electro-optic devices (e.g., splitters), solar cells, and controllably charging a quantum dot in a photonic crystal cavity.

More specifically, light emitting diodes (LEDs) are of particular interest in connection with these principles. Light-emitting diodes are normally not seen as effective optical transmitters for communications because: 1) they emit light in too many spectral modes, 2) their energy consumption is large, and 3) they switch too slowly because the modulation rate is limited by the spontaneous emission lifetime. LEDs according to principles described herein address all of these issues. The photonic crystal cavity is intrinsically single-mode in nature because of its small physical volume. Light can only be emitted in one of a few channels, or cavity modes, allowing efficient collection of light. The small size of the light emitting region in the device, combined with efficient electrical injection as described herein enables a small energy consumption—the device operates at micro-Amp current and is biased at ~1V.

To address the third issue of slow switching speed, we demonstrated a way to modify the electronic properties of our quantum dots. A rapid thermal anneal fabrication step modifies the material composition and size of the quantum dots, and this lowers the potential energy for carrier escape. Injected electrons and holes are therefore no longer limited by long (1 nanosecond) spontaneous emission lifetimes causing slow LED speed. Instead, carriers can escape within a few picoseconds and subsequently quench emission, allowing ultrafast modulation speeds. More generally, we have found ways to ensure that the carrier lifetime in the optical resonator is substantially less than the spontaneous radiative lifetime of the gain medium that is disposed in the optical resonator. Preferably, the carrier lifetime in the resonator is at least 10× (more preferably at least 100×) less than the gain medium spontaneous radiative lifetime. For example, 10-20 ps carrier lifetime and 200 ps to 2 ns radiative lifetime. Moreover, the small optical volume and good quality factor of the cavity mode may also enable large spontaneous emission rate enhancement (Purcell effect) of the emission coupled to that mode—also enabling faster operation.

Such LEDs can have various applications, such as electrically driven sources for optical interconnects, and fast sources for long-haul fiber-optic communications. This technique can be applied to any kind of gain medium in the photonic crystal cavity, such as quantum wells, quantum wires, quantum dots, nanocrystals, and dopant ions. More generally, the present approach is applicable to any optical emitter where a carrier lifetime less than the spontaneous radiative lifetime is desired. Advantages of the present approach include operation at room temperature and being electrically driven, thereby facilitating system integration.

BRIEF DESCRIPTION OF THE DRAWINGS

FIGS. 1a-d show an exemplary fabrication sequence for use in connection with embodiments of the invention.

DETAILED DESCRIPTION

Figure 1E:
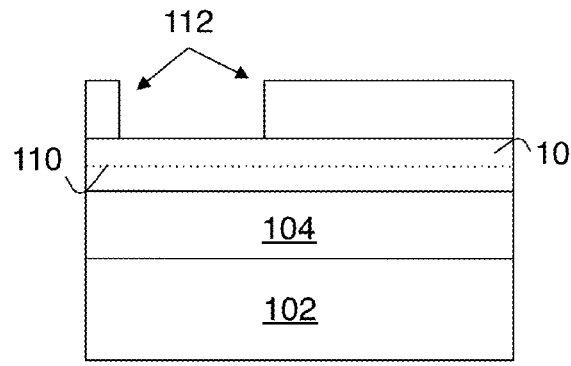
FIG. 1e shows a top view of an embodiment of the invention.
Figure 1E:
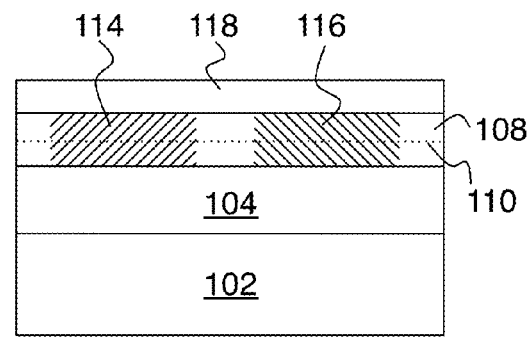
Figure 1E:
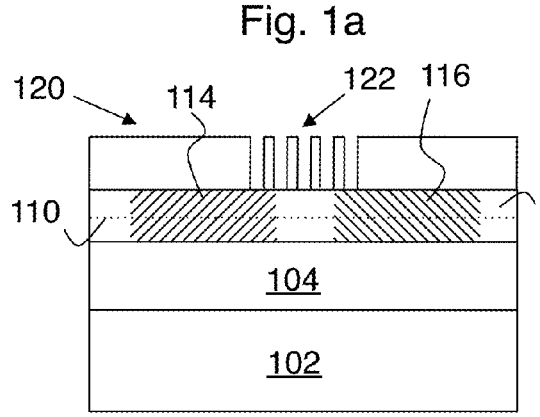
Figure 1E:
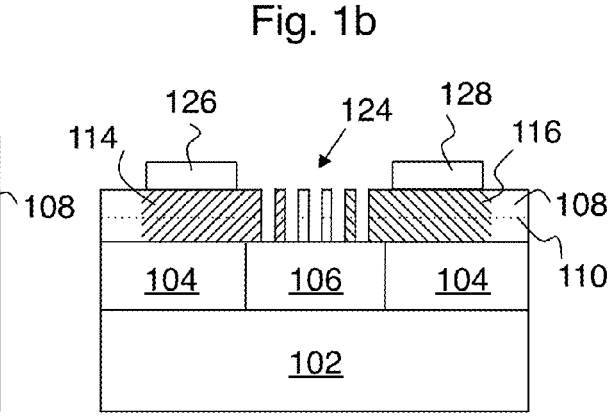
Figure 1E:
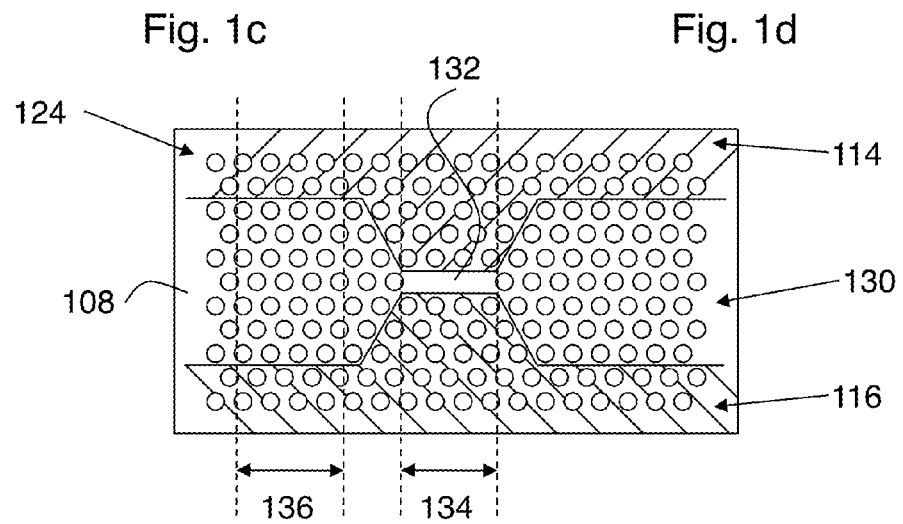

The following description relates to experimental investigations according to the above described principles. More specifically, section A below relates to laser experiments and section B below relates to light emitting diode (LED) experiments.

A) Laser Experiments

A schematic of the fabrication process is shown in FIGS. 1a-d. Briefly, Si and Mg ions are implanted through a silicon nitride mask patterned by electron beam lithography (FIGS. 1a-b). Next, the implanted dopants are activated by annealing at 900 C for 30 s with a nitride cap which is subsequently removed by dry etching. (FIG. 1b). Next, the photonic crystal pattern is defined in a resist by electron beam lithography and transferred into the GaAs membrane by dry etching (FIGS. 1c-d). Finally, the $Al_{0.9}Ga_{0.1}As$ sacrificial layer is oxidized and the p and n contacts are deposited by photolithography and liftoff.}

The wafer used in this experiment has a 1 μm $Al_{0.9}Ga_{0.1}As$ sacrificial layer 104 and a 130 nm GaAs membrane 108 with one layer 110 of high density ($1 \times 10^{10}$ $cm^{-2}$) InAs quantum dots in the middle. These layers were disposed as shown on a GaAs substrate 102. First, a dry-etcher is used to define alignment marks. Next Si ions at an energy of 71 keV and a dose of $4 \times 10^{13}$ $cm^{-2}$ and Mg ions at an energy of 55 keV and a dose of $5 \times 10^{13}$ $cm^{-2}$ are implanted through a 330 nm nitride mask 112 that is patterned by electron beam lithography. Si and Mg ions are chosen because they offer the best combination of low damage, high activation efficiency, and a low diffusion coefficient. FIG. 1a shows the nitride mask for the Si implantation that provides n-type region 114. A similar nitride mask was used for the Mg implantation that provides p-type region 116. Any other doping method can also be employed (e.g., regrowth and diffusion doping).

Figure 2:
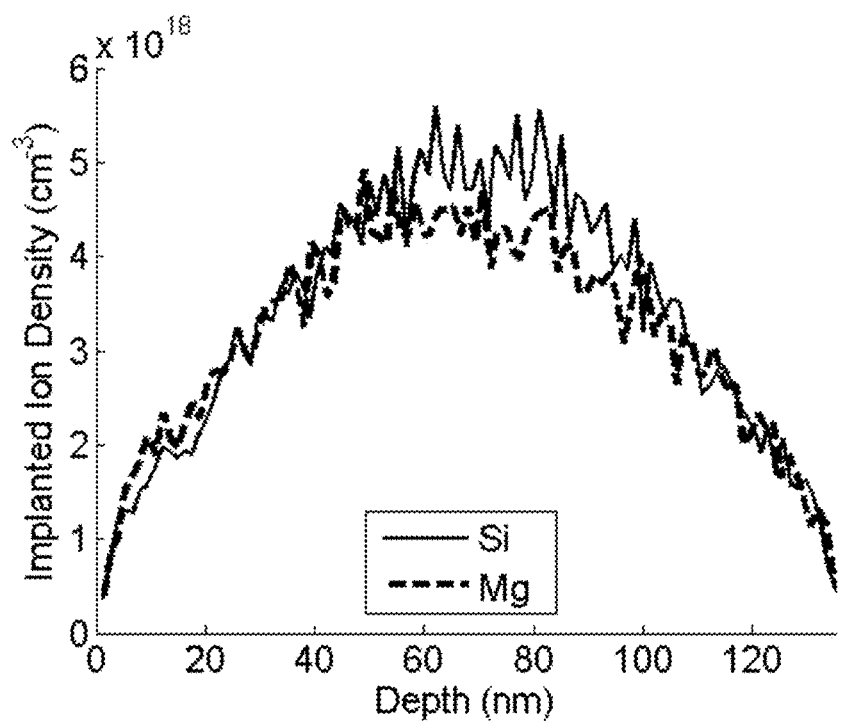
FIG. 2 shows ion implantation profiles from an experiment relating to an example of the invention.

FIG. 2 shows the simulated ion distribution as a function of depth. The energies of the ions are chosen so that the maximum of the dopant distribution is in the middle of membrane 108 and the doses are chosen to be well below the amorphization dose. Next, the samples are annealed at 900° C. for 30 seconds to remove most of the ion implantation induced damage and activate the dopants. It was found that use of a 30 nm nitride cap (118 on FIG. 1b) was helpful to prevent As outdiffusion during the anneal step. After the anneal, the PC pattern 122 was defined by electron beam lithography of a resist 120 (FIG. 1c) and dry-etched into membrane 108 to form the PC 124 (FIG. 1d). The $Al_{0.9}Ga_{0.1}As$ sacrificial layer 104 underneath the GaAs membrane 108 was then oxidized in an oxidation furnace to form aluminum oxide 106 (FIG. 1d). Next a Au—Ge—Ni—Au n-type contact 126 and a Au—Zn—Au p-type contact 128 were deposited, and the contacts were annealed at 450° C. for one minute (FIG. 1d). Based on the results of Hall effect and electrochemical capacitance voltage (ECV) measurements we estimate the maximum n-type doping concentration in the middle of the membrane to be about $8 \times 10^{17}$ $cm^{-3}$ and the maximum p-type doping concentration to be about $3 \times 10^{18}$ $cm^{-3}$. These concentrations are consistent with dopant activation efficiencies measured elsewhere.

Figure 3:
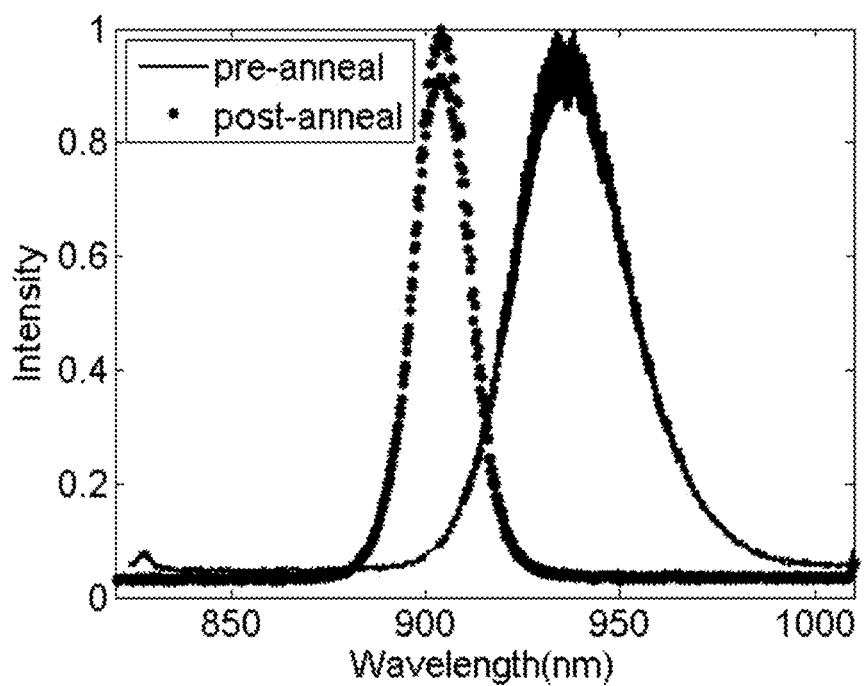
FIG. 3 shows pre-anneal and post-anneal quantum dot luminescence.

To study the effect of the doping process on the quantum dot photoluminescence, the samples were cooled to 30K. The cooling was performed because the shallow-confinement InAs quantum dots do not emit at room temperature. FIG. 3 shows the quantum dot photoluminescence (PL) from a region with no implanted ions before and after the activation anneal. The quantum dot density in our wafer is too high to see the emission lines of individual quantum dots, and we instead see a Gaussian distribution of emission where the full-width half maximum (FWHM) is determined by the inhomogeneous broadening of the dot ensemble. The quantum dot emission is grown to be centered at 940 nm; however the activation anneal step causes the dots to blue shift by about 30 nm. Interestingly, the FWHM of the quantum dot emission is reduced by a factor of 2, indicating a reduction of the inhomogeneous broadening. Previous studies of this effect have found that rapid thermal annealing of quantum dots can actually be beneficial for laser applications because the FWHM of the dot distribution narrows, increasing the available gain; however the blue shift of the emission wavelength must be compensated for during the growth. Ion implantation induced damage introduces nonradiative recombination centers, and the PL intensity was observed to decrease significantly in the implanted regions, similar to what has been observed in other experiments. The unimplanted regions are left undamaged, so the emission intensity there is unaffected.

Figure 4:
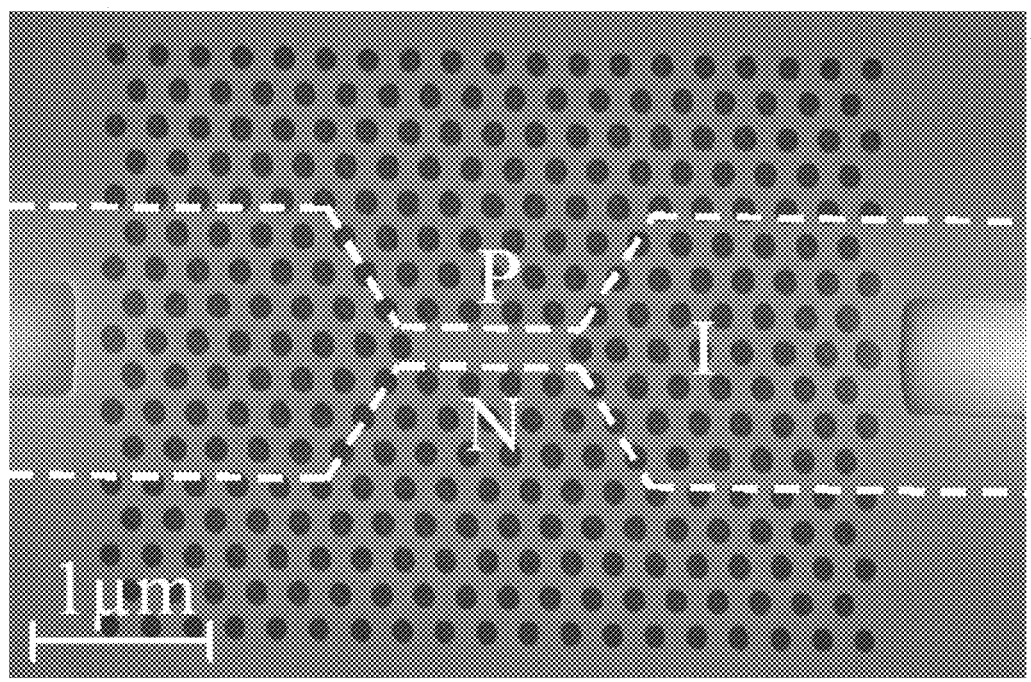
FIG. 4 shows a top view SEM photograph of an embodiment of the invention.
Figure 5:
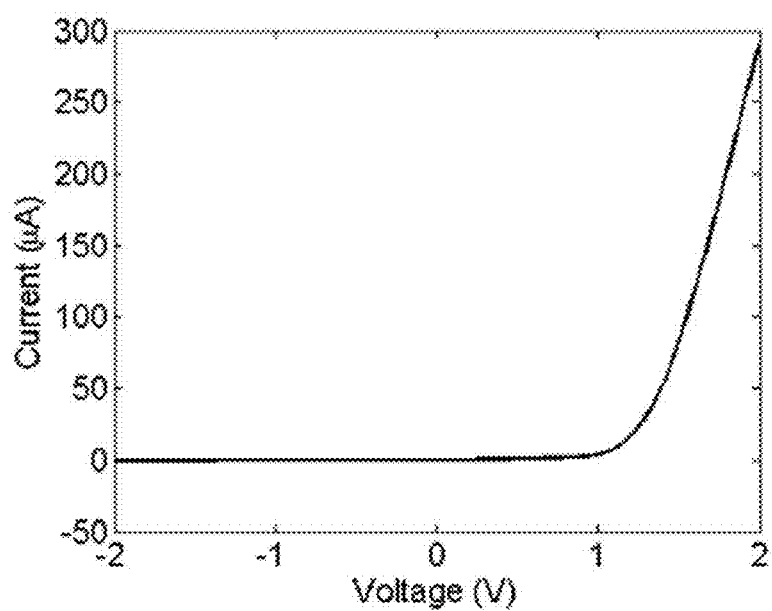
FIG. 5 shows an experimentally measured I-V curve.

The doping layout is shown in FIG. 4 (and also on FIG. 1e). FIG. 4 is an SEM photograph of an experimental device. The edges of the p and n doped regions are indicated by white dashed lines on FIG. 4. We employ a linear, three hole defect PC cavity design where the end holes have been shifted to increase the quality factor (as described in greater detail in the above-referenced articles by Akahane et al. and Ellis et al). Away from the cavity region the intrinsic region is wider than the ambipolar diffusion length. The combination of the wide intrinsic region of the diode and the PC holes form a high resistance region reducing leakage current. In the cavity region the intrinsic region of the diode is designed to be between 200 and 400 nm wide. To confirm that dopant diffusion during the activation anneal does not drastically change the dopant layout, a scanning capacitance atomic force microscope was used to image the dopant distribution on devices without PCs. These results (not shown here) indicate the presence of the desired doping without topographical effects. To make the cavities easier to test electrically, the cavities were electrically connected in parallel, ten of them per pair of contacts. The IV curve of ten cavities in parallel is shown in FIG. 5. From this we infer that the current density in the cavity region is high, around $10^3$ $A/cm^2$ at an applied voltage of 1.5V. Previous studies of the electrical properties of doped photonic crystals have found that the surface depletion region around the holes affects the series resistance. This is because the depletion region at the hole edges, and at the top and bottom of the membrane decreases the available volume for conduction. Carrier transport in the photonic crystal is determined by the electrical effective air fill factor $f_{elec} = (\pi/2 \sqrt{3})[(d+2\delta)^2/a^2]$, where δ is the depletion width, d is the membrane thickness, and a is the spacing between photonic crystal holes. We estimate that the depletion width δ is approximately 45 nm and 30 nm in the n and p-type regions, respectively, indicating that the membrane is likely not fully depleted.

Figure 6:
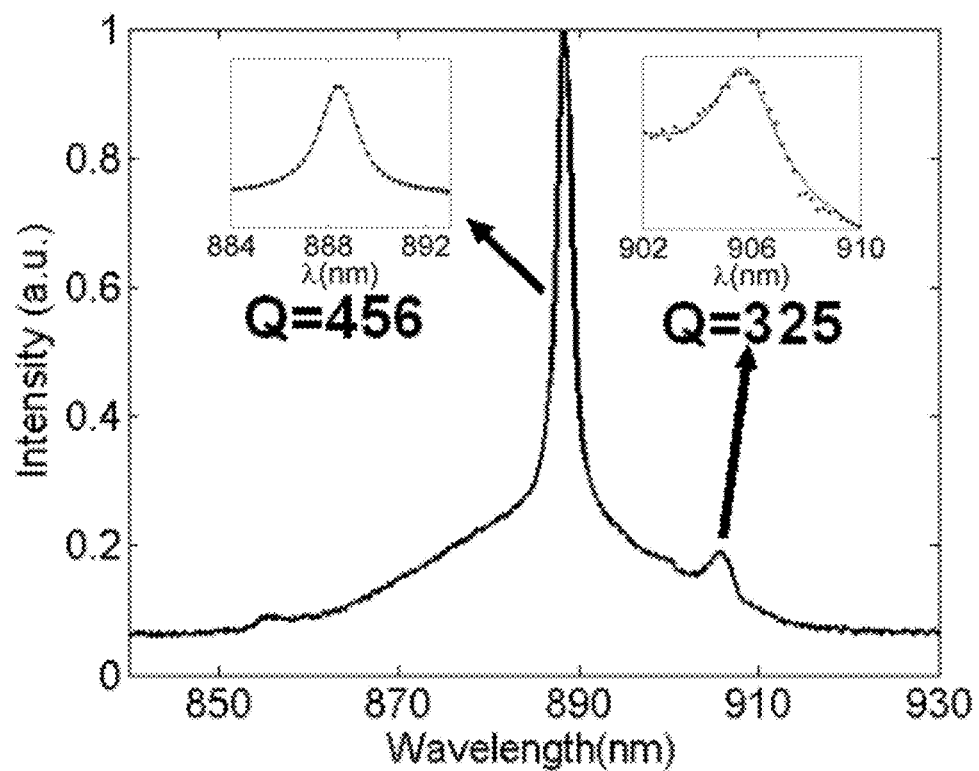
FIG. 6 shows experimental electroluminescence results.

Next, the sample was cooled to 30K, 1.6V of forward bias was applied to the cavity, and the EL was imaged by a confocal microscope. The EL was seen to be confined to the cavity region, confirming that the devices have a low leakage current. A pinhole was used to collect the emission from only one cavity, and the spectrum of a single cavity is shown in FIG. 6. The insets show Lorentzian fits to the experimental cavity spectrum to determine the quality factor. Two cavity modes are observed with quality factors of approximately 400. FDTD simulations indicate that the highest wavelength mode is the fundamental mode of the cavity. The simulated Q of the cavity is approximately 2000, and is limited by the high refractive index (n≈1.72) aluminum oxide layer 106 under the cavity. No lasing was observed from the cavities even at high current and pulsed pumping conditions. However, the demonstrated structures are also interesting for a variety of electrically injected devices such as LEDs and modulators that do not require gain in addition to lasers.

We now consider the properties of the this experimental device which prevent it from reaching the lasing regime. Lasing from photonic crystal nanocavities has been previously demonstrated with optical pumping in this material. The condition for optical gain is the Bernard-Duraffourg condition, $(F_c-F_v)>\hbar\omega$, where $(F_c-F_v)$ is the separation of the quasi-Fermi levels and $\hbar\omega$ is the emission energy. From Poisson simulations, we conclude that the doping densities in our device are not high enough to satisfy this condition. This indicates that the doping must be increased to reach population inversion and lasing. Simulations of the ion implantation induced damage indicate that the ion doses for both the Si and Mg doping steps can be increased by about a factor of 5 before the damage begins to amorphize the membrane. Because some of this damage will be annealed out in the activation step, it is not clear how much the ion dose can be increased before there is too much damage to achieve lasing. Alternatively a lighter dopant such as Be will generate fewer vacancies during implantation and therefore can be used to achieve higher doping densities. Be has been used to demonstrate ion implantation doped edge emitting lasers in GaAs before.

In a second experimental device, lasing has been demonstrated. For this second device, the intrinsic region is designed to be 400 nm wide in the cavity region and extends to 5 µm wide to the sides of the cavity. This design efficiently directs the current flow through the cavity region. We choose a modified 3-hole defect PC cavity design. FDTD simulations the fundamental cavity mode give a theoretically estimated quality factor of 115,000, comparable to previous studies of similar cavities.

Ion implantation of Be and Si ions is used to dope the p- and n-type regions respectively. Because implantation of high energy ions causes some lattice damage that will reduce the gain, it is important that the p and n regions are precisely aligned to the PC cavity to avoid damaging the active region. We developed a fabrication procedure where the ions are implanted through silicon nitride masks patterned by electron beam lithography to achieve approximately 30 nm alignment accuracy. The gain material for the laser is three layers of high density (300 µm$^{-2}$) InAs quantum dots. In order to activate the ion implanted dopants, we perform a high temperature anneal. We optimized this anneal procedure to give sufficient dopant activation without significantly changing the emission properties of the quantum dots. After the activation anneal we find that the peak photoluminescence wavelength of the quantum dots is 1175 nm at 100 K. We find that the average doping density in the membrane (after dopant activation) is $6.0\times10^{17}$ cm$^{-3}$ and $2.5\times10^{19}$ cm$^{-3}$ in the n and p regions respectively.

Further details on the growth and fabrication of this sample follow. The wafer was grown using molecular beam epitaxy. Starting with a semi-insulating substrate, a 1 µm $Al_{0.95}Ga_{0.05}As$ sacrificial layer was grown, followed by a 220 nm GaAs membrane that contained three layers of InAs quantum dots separated by 50 nm GaAs spacers. The dots were formed by depositing 2.8 monolayers of InAs at 510° C. using a growth rate of 0.05 monolayers/s. The dots were capped with a 6 nm $In_{0.15}Ga_{0.85}As$ strain reducing layer. The resulting dot density was approximately 300 dots/µm$^2$ as confirmed by atomic force microscopy measurements of uncapped quantum dot samples.

In fabrication, alignment marks were defined on the unpatterned wafer using electron beam lithography and dry-etched around 100 nm into the membrane using an $Ar/Cl_2/BCl_3$ electron-cyclotron resonance reactive ion etch (ECR-RIE). Next, a 330 nm layer of silicon nitride was deposited on the sample using plasma-enhanced chemical vapor deposition (PECVD) to serve as a mask for ion implantation of Si. Electron beam lithography was used to pattern the n-type doping region, and an $SF_6/C_2F_6$ dry etch was used to remove the nitride from the n-type doping area. Si ions were implanted at an energy of 115 keV and a dose of 3e14/cm$^2$. An $SF_6/C_2F_6$ dry etch was used to remove the remaining silicon nitride, and another 330 nm layer of silicon nitride was deposited on the sample using PECVD to serve as the mask for ion implantation of Be. Electron beam lithography was used to pattern the p-type doping region and an $SF_6/C_2F_6$ dry etch was used to remove the silicon nitride from the p-type doping area. Be ions were implanted at an energy of 32 keV and a dose of 2.5e15/cm$^2$. An $SF_6/C_2F_6$ dry etch was used to remove the remaining silicon nitride. A 40 nm tensile strained silicon nitride cap was deposited using PECVD to prevent As out-diffusion during the subsequent high temperature anneal. The samples were then annealed at 850° C. for 15 s in a rapid thermal annealer to activate the dopants and remove almost all of the lattice damage caused by the ion implantation. An $SF_6/C_2F_6$ dry etch was used to remove the nitride cap. The photonic crystal pattern was defined using electron beam lithography and etched into the membrane using an $Ar/Cl_2/BCl_3$ ECR-RIE. Simultaneously with the photonic crystal, trenches were etched to the sides of the cavity and all the way around each of the contacts; this was found to reduce the leakage current to reasonable levels. Next, the photonic crystal was loaded in a wet thermal oxidation furnace and the sacrificial layer was oxidized at 465° C. for 7 minutes. Photolithography and electron beam evaporation were used to define Au/Ge/Ni/Au n-type contacts in a lift-off process. Photolithography and sputtering were used to define Au/Zn/Au p-type contacts also in a lift-off process. The contacts were then annealed at 415° C. for 15 s to achieve minimum contact resistance. Finally, 45% potassium hydroxide solution in water was used to remove the oxidized sacrificial layer underneath the cavity leaving an air-clad photonic crystal membrane.

To confirm the doping layout before fabrication of the PC cavity we use scanning capacitance atomic force microscopy (SCM). Hall effect was used to find the carrier sheet concentration in semi-insulating GaAs test samples implanted with the same conditions as the laser samples. The doping profile was measured using an electrochemical capacitance voltage measurement using 0.1 M NaOH with Ethylenediaminetetraacetic acid (EDTA) surfactant as the electrolyte. An atomic force microscope with a scanning capacitance attachment was used to measure the doping layout on the actual laser samples on devices without photonic crystals. A two plate capacitor setup for scanning consisted of the sample, native surface oxide, and a gold coated AFM tip used in contact mode with a scanning bias of 1 V.

It has been found that the diffusion coefficient of Be in GaAs is much higher than that of Si, especially for Be concentrations above $10^{19}$ cm$^{-3}$. Therefore, it was expected that the activation anneal will redistribute the dopants significantly. We used high resolution scanning capacitance microscopy (SCM) to approximate the extent of dopant diffusion. SCM data is a combination of the phase and amplitude of capacitance data taken spatially across the sample where the gold AFM tip and sample act as the capacitor plates and the native oxide as an insulator between them. The strength of the signal is directly proportional to the intensity of doping in the local region underneath the tip. The technique relies on the fact that the silicon nitride implant mask introduces some surface roughness that is visible on the AFM topography scan. This surface roughness can then be compared to the location of the edge of the doping to determine the amount of dopant diffusion during the activation anneal.

With this method, we determine that the Be doping edge is approximately 300 nm from the mask edge and the Si doping edge is approximately 150 nm from the mask edge. This allows us to determine the precise location of the dopants and position the photonic crystal cavity directly in the center of the intrinsic region.

AFM topography and SCM data for similar structures without PCs demonstrated that the desired dopant layout is achieved. From this data we can identify the exact locations of the doping regions and precisely position the PC cavity in the center of the intrinsic region. The parameters of the cavity are chosen so that the fundamental cavity mode is at a wavelength of 1174 nm at low temperature, within the ground state emission of the quantum dots. We confirm that this mode is the fundamental mode of the cavity by identifying the higher order cavity modes in the electroluminescence spectra and comparing them with FDTD results.

As mentioned above, a high temperature anneal is performed to activate the ion implanted dopants and remove most of the lattice damage caused during implantation. In order to optimize the annealing conditions to achieve a high doping density, we implanted semi-insulating GaAs samples under the same conditions as the laser samples. We tested the activation efficiency of our dopants for rapid thermal anneal temperatures between 800° C. and 900° C. for a range of times between 10 and 30 s. We found that Be activates most efficiently at 800° C. while Si activates most efficiently at 900° C. We chose an intermediate anneal temperature of 850° C. for 15 s. Room temperature Hall effect measurements were used to characterize the doping density of the test samples. Using Hall effect, we found a sheet carrier density of $7.9*10^{14}$ cm$^{-2}$ ($1.1*10^{12}$ cm$^{-2}$) and a mobility of 126 cm$^2$/Vs (1930 cm$^2$/Vs) for the p-type (n-type) sample. The high mobility values indicate that the anneal step was effective in removing much of the lattice damage. Electrochemical capacitance voltage (ECV) measurements were used to determine the doping density as a function of depth. The sheet carrier density found by integrating the ECV data is comparable to the sheet density measured using Hall effect.

The high temperature anneal also affects the emission properties of the quantum dots. Previous studies of this effect have found that high temperature anneals tend to blueshift the quantum dot photoluminescence and narrow the inhomogeneous broadening of the quantum dot ensemble. This could be beneficial for laser applications because theoretically the quantum dot gain could be increased by annealing. The effects of the activation anneal on the quantum dots are summarized as follows. We observe no significant narrowing of the photoluminescence full width half maximum, but there is a significant blueshift. The photonic crystal cavities are designed to have the fundamental mode resonant with the ground state of the quantum dot photoluminescence after annealing when the sample is at low temperature.

For optical testing, the sample was epoxied to an alumina chip carrier using nonconductive, vacuum-safe epoxy. Aluminum wirebonds were used to connect individual devices to the leads of the chip carrier, and the chip carrier was loaded into a continuous flow helium cryostat with custom designed coldfinger and electrical feedthroughs. The temperature was stabilized to within half a degree Kelvin. Currents were applied using a sourcemeter with sub nA accuracy. The emission from the sample was collected using an objective lens with numerical aperture 0.5 in the direction perpendicular to the sample surface. Emission spectra were measured using a spectrometer with a liquid-nitrogen cooled InGaAs charge coupled device (CCD) detector and luminescence images were taken with an InGaAs CCD camera.

Figure 7A:
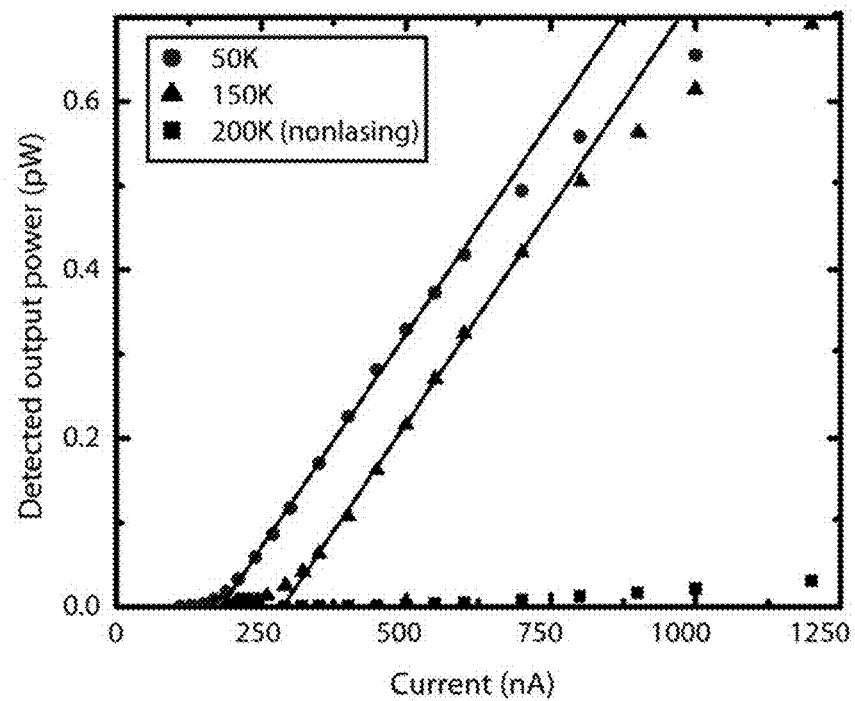
FIGS. 7a-b show experimental lasing results from an embodiment of the invention.
Figure 7B:
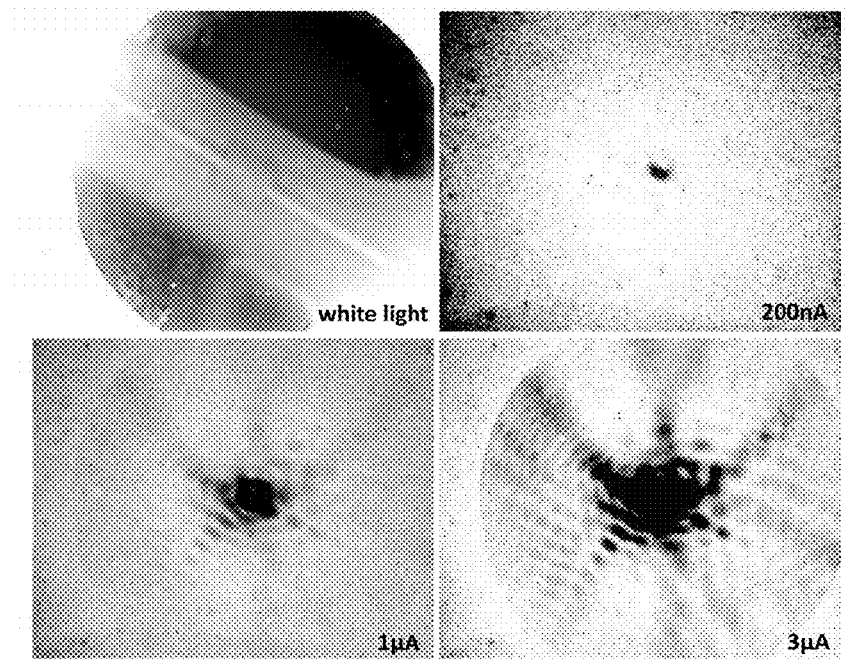

FIG. 7a shows the optical output power of the laser as a function of continuous wave pump current at several different temperatures. We observe a clear lasing threshold for temperatures below 150 K. As the temperature increases, the quantum dot resonance wavelength and the cavity resonance wavelength red-shift at different rates. At higher temperatures, the photonic crystal cavity resonances are no longer within the gain bandwidth of the quantum dots. A measurement on the same structure at 200 K where no lasing is observed is included for comparison. To determine the threshold of our laser we use a linear fit to the above threshold characteristics and extrapolate it to zero-output power (lines in FIG. 7a). We find that the threshold of our laser is 181 nA at 50 K and 287 nA at 150 K. To the best of our knowledge, this is the lowest threshold ever demonstrated in an electrically pumped semiconductor laser. It is 3 orders of magnitude better than the 260 µA threshold demonstrated in quantum well PC cavity lasers and more than an order of magnitude better than the thresholds demonstrated in metal-clad lasers and micropost lasers. The low thresholds demonstrated herein can be attributed to the better control over the current flow, and the reduced surface recombination in quantum dot based photonic crystal lasers. At threshold, the applied voltage is only 1.15 V at 50 K and 1.03 V at 150 K, meaning that at threshold the lasers consume only 208 nW at 50 K and 296 nW at 150 K. From the collected power, we estimate the total power radiated by the laser to be on the order of a few nW well above threshold. FIG. 7b shows the experimental far-field radiation pattern of the cavity at various current levels.

Figure 8A:
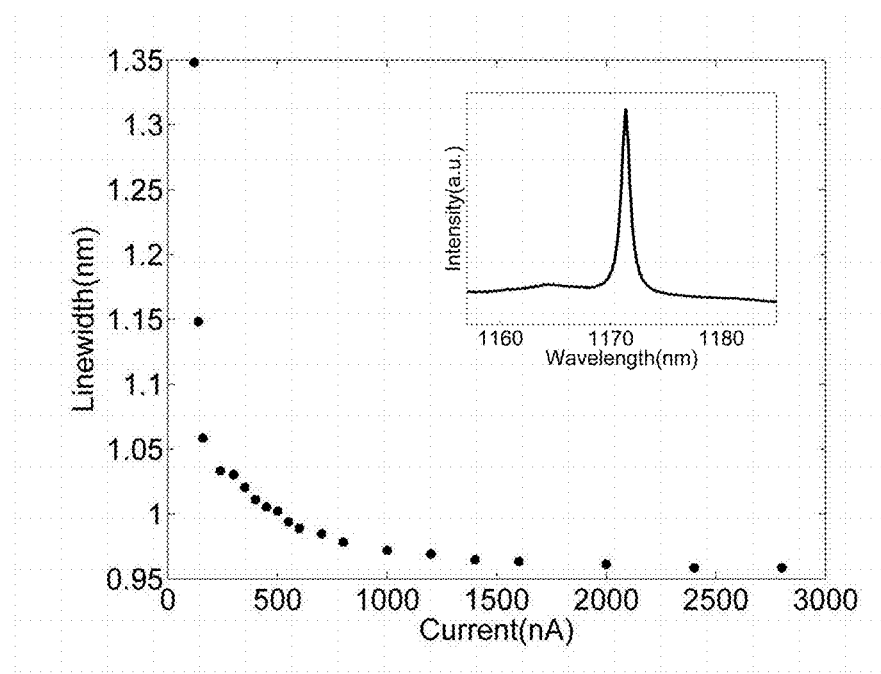
FIGS. 8a-b show further experimental results from the embodiment of FIGS. 7a-b.

The laser linewidth (full width half maximum) as a function of current is plotted in FIG. 8a. The linewidth narrows from around 1.35 nm just below threshold to 0.95 nm well above threshold. The quality factor of the cavity mode at threshold is approximately 1130. This quality factor is significantly smaller than expected from FDTD simulations. The low quality factor is likely due to free carrier absorption or surface roughness introduced by the fabrication procedure. Room-temperature optically pumped lasing in nanocavities with similar quantum dots has recently been demonstrated, and we believe that further refinements to the fabrication procedure will allow us to demonstrate electrically pumped lasing at room temperature.

Figure 8B:
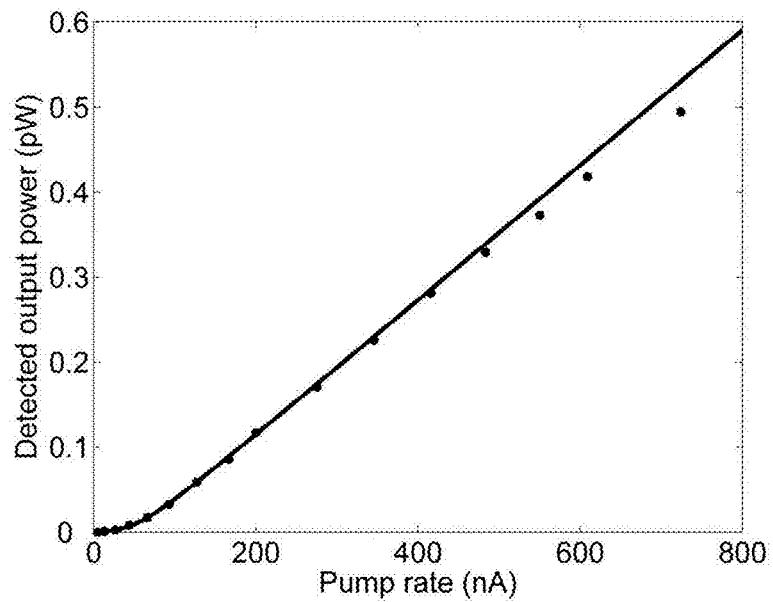

Although we have optimized our device design to reduce leakage current, at low voltages before the diode has fully turned on we observe leakage current bypassing the cavity through the sacrificial layer and substrate. Therefore, if the device design is further improved to reduce this leakage, the threshold could be significantly lower. To find the potential threshold reduction, we fit the current voltage characteristics to an ideal diode equation to determine the fraction of current flowing through the cavity as a function of applied voltage. The light output of the laser as a function of the current after subtracting the leakage is plotted in FIG. 8b (points) along with a fit to the laser rate equations (line). From the fit and simulations of the Purcell factor in our cavity we determine that the fraction of spontaneous emission that is coupled to the cavity mode (commonly called the β-factor) is between 0.29 and 0.41 in our laser. The laser threshold after correcting for the leakage current is only 70 nA.

In summary, we have demonstrated that a lateral p-i-n junction can be used to electrically pump a GaAs PC nanocavity. The properties of an ion implantation doped PC light emitting diode are studied, and efficient electroluminescence from an L3 nanocavity is demonstrated. The electrical properties of the device and the improvements necessary to make a laser are presented.

We have also designed and demonstrated an electrically pumped quantum dot photonic crystal nanocavity laser. The laser operates in continuous wave mode at temperatures up to 150 K, and exhibits ultralow thresholds of 181 nA at 50 K and 287 nA at 150 K. If we subtract the leakage current flowing into the substrate, the threshold current is estimated to be around 70 nA. These lasing thresholds are three orders of magnitude lower than previous demonstrations of electrically pumped PC nanocavity lasers, and lower than any electrically injected laser so far. We believe that room temperature operation is possible if the quality factors of the cavity can be improved, and if the cavity resonances are better aligned to the quantum dot gain spectrum at room temperature. In addition, it should be possible to integrate this laser on a Si chip by wafer bonding techniques if the high temperature steps are performed before bonding. The low power dissipation of these lasers makes them very promising for applications in optical interconnects and high speed communications as well as for fundamental studies of the properties of electrically pumped thresholdless lasers and lasers with single-emitter gain.

B) LED Experiments

B1) Introduction

Optical interconnects have attracted much research attention in recent years owing to potential performance and power consumption improvements over traditional electrical connectivity. A complete optical interconnect link includes a modulated optical source, passive components to route light, a photodiode for detection, and driving circuitry. In order to be a viable solution for next generation systems, the complete energy budget for an optical link should be about 10 fJ/bit, while the operating speed should be at least 10 GHz. Unfortunately, previously demonstrated laser sources have μW to mW thresholds and the best external modulators consume 100 s of fJ to pJ/bit level energies. As an alternative to the standard approach of using a continuous wave laser and external modulator, direct modulation of a fast optical source can drastically reduce the energy consumption for the transmitter. A recent demonstration, by others, of all optical switching of a photonic crystal (PC) cavity laser showed fast 20 Gb/s switching at low power, corresponding to an energy of only 8.76 fJ/bit. This technique relied on optical pumping however, and is difficult for on-chip integration.

In section A, we demonstrate an electrically driven photonic crystal quantum dot (QD) nanocavity laser with world record low threshold of 208 nW based on a lateral p-i-n junction defined by ion implantation in gallium arsenide. This electrical pumping scheme allows for efficient current injection into the intrinsic cavity region. Controlling photonic crystal cavities electrically leverages their advantages such as low power and single mode emission while maintaining practical integration. The demonstrated nanolasers operate at temperatures up to 150K before transitioning to single-mode light-emitting diode (LED) operation at room temperature due to reduced quantum dot gain. Although power output is smaller in the LED regime, it is still in the range usable for optical interconnects where sensitive photodetectors exist; moreover, we are able to exploit the fast switching properties of single mode output from a nanocavity.

In this section, we show that we are able to electrically switch such a single-mode photonic crystal nanocavity LED at 10 GHz speed and at room temperature with electrical injection power at the μW level. Since a photonic crystal cavity has only a few unique modes in spectrally distant locations, our diode is effectively a single mode light source and can be used as a fast, low power transmitter for optical interconnects.

B2) Results

B2a) Device Design and LED Operation

Figure 9A:
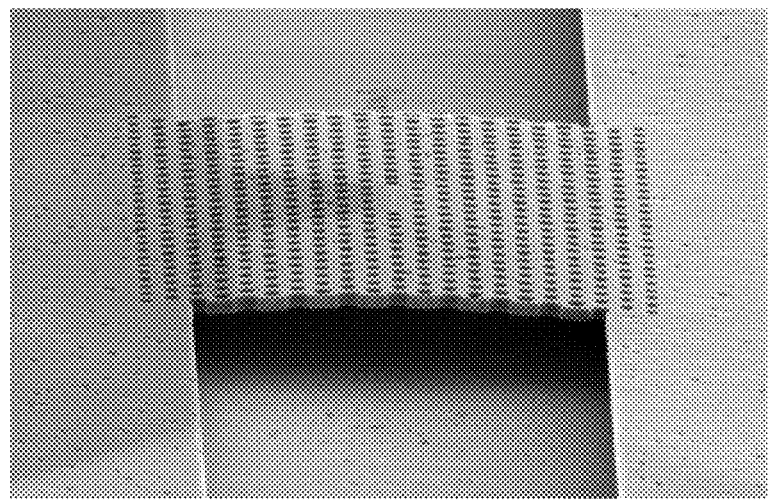
FIG. 9a is a scanning electron microscope (SEM) image of an LED according to an embodiment of the invention.
Figure 9B:
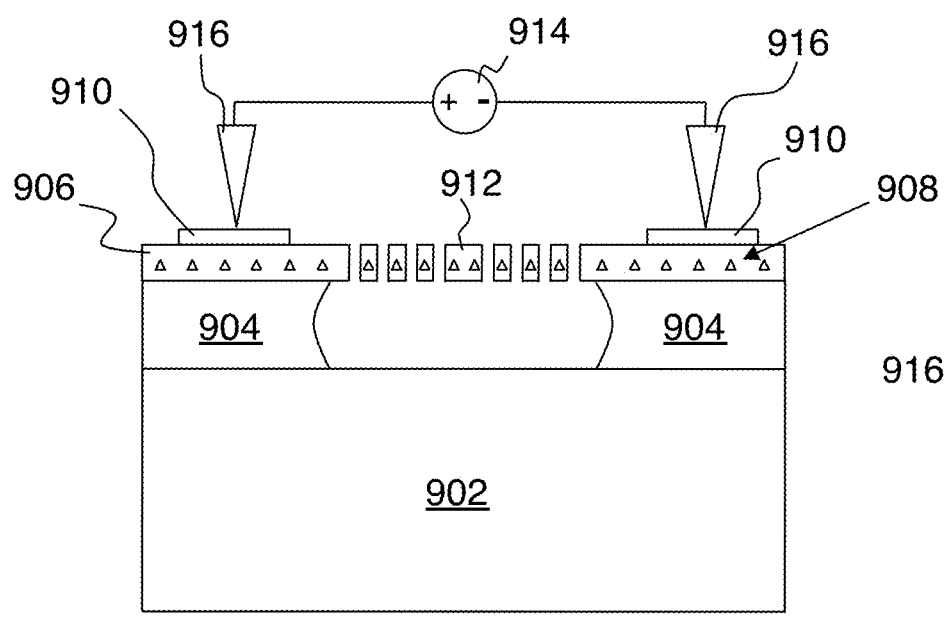
FIG. 9b shows a vertical cross-section layout of an exemplary LED device structure.
Figure 9C:
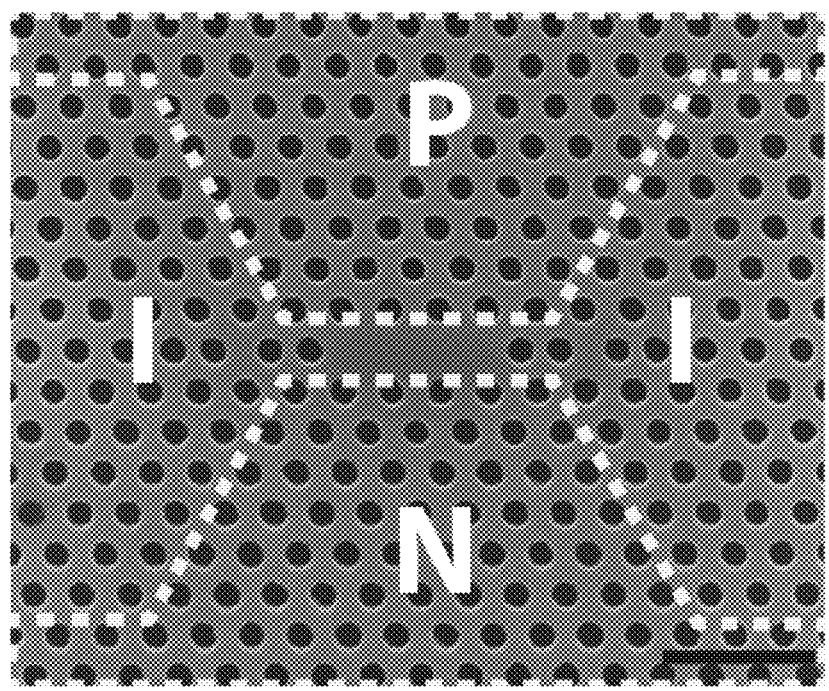
FIG. 9c is a top view SEM image showing approximate boundaries of doping regions.

FIG. 9b shows a vertical cross section of a representative LED device. In this example, a GaAs photonic crystal layer 906 is suspended above a GaAs substrate 904 by an AlGaAs layer 904. Quantum dots 908 are represented by small triangles. A photonic crystal cavity 912 is present in PC layer 906. Electrical bias to cavity 912 can be provided via source 914, electrodes 916, and contact pads 910. FIGS. 9a and 9c provide representative SEM images of a fabricated LED. A series of ion implant steps through a silicon nitride mask defined the lateral p-i-n junction in a 220 nm thick GaAs membrane with embedded high density quantum dots, as above. After an activation anneal for the dopants, photonic crystals were patterned and transferred to the membrane through a dry etch step. Metal contacts were then deposited and the sacrificial AlGaAs layer beneath the GaAs membrane was wet etched to release the photonic crystal structures. We chose a modified L3 defect cavity design with a fundamental mode wavelength within the inhomogeneous distribution of the QD ensemble, centered near 1,230 nm at room temperature. The fundamental mode for this cavity design has a theoretical quality factor in excess of $10^5$ as calculated from finite-difference time domain (FDTD) simulations.

Figure 9D:
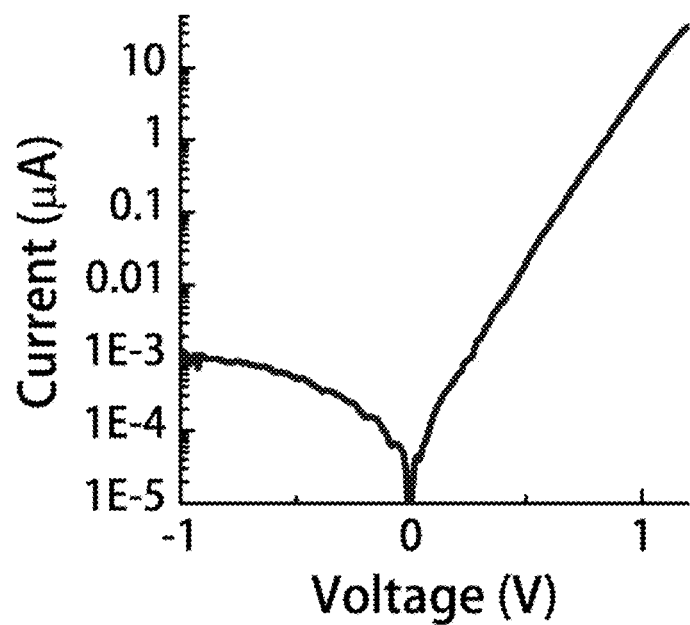
FIG. 9d is an LED current-voltage measurement.

The measured current-voltage characteristics for a device are shown in FIG. 9d. Our LED has robust electrical properties with over three orders of magnitude on/off ratio and minimal leakage current. In contrast to the laser diode described above, we have eliminated the substrate leakage path by oxidizing the sacrificial layer for a longer time, as described below (Methods section), and now all of the current travels through the PC membrane. Only 3-4% of the current is estimated to leak through the wide intrinsic region mirrors of the device, with the remaining 96-97% flowing through the cavity. The measured series resistance of 1.3 kΩ is mostly due to the sheet resistance of the thin membrane, modified by the air hole fill factor which decreases the effective current cross section.

Figure 10A:
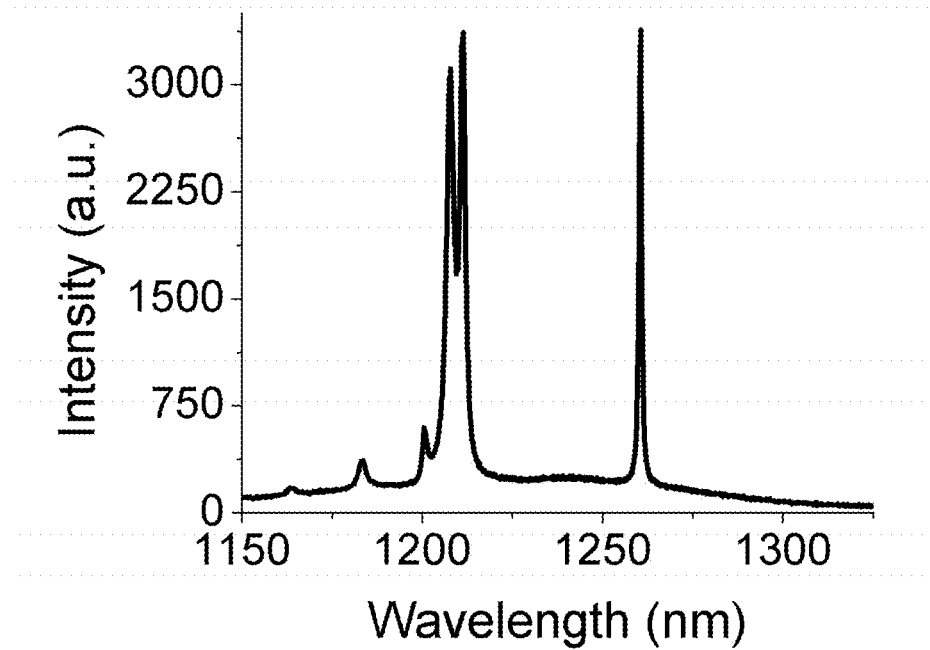
FIGS. 10a-d show optical properties of LEDs under DC bias.
Figure 10B:
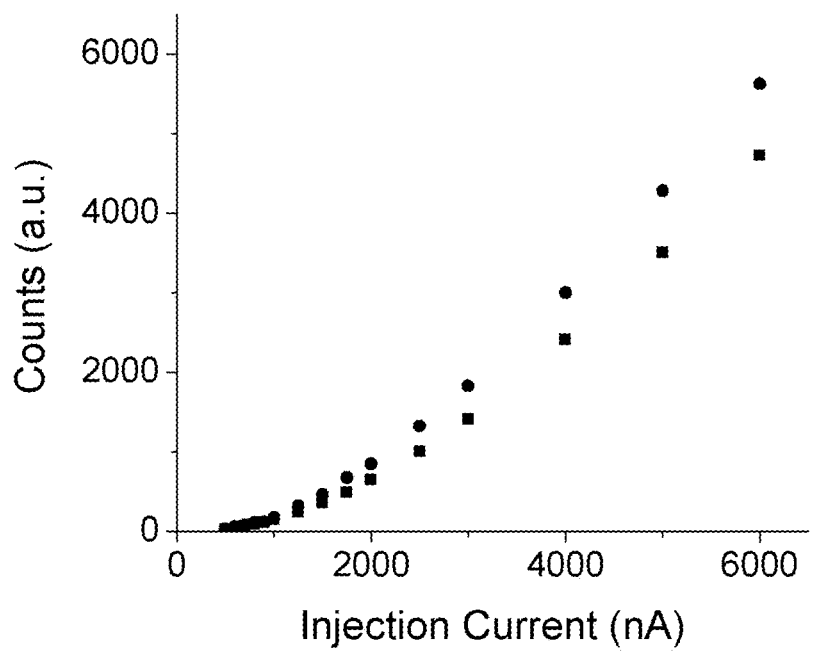
Figure 10C:
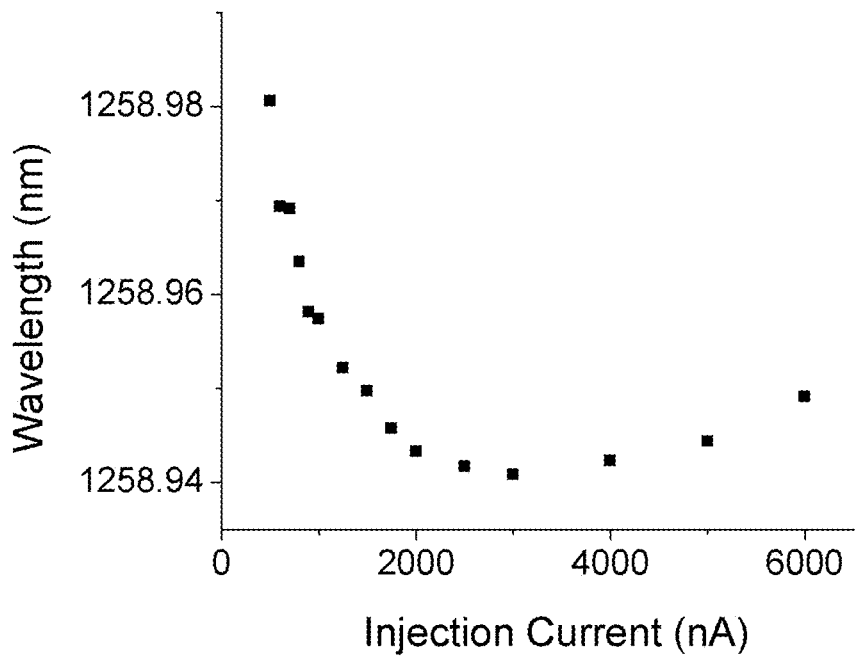
Figure 10D:
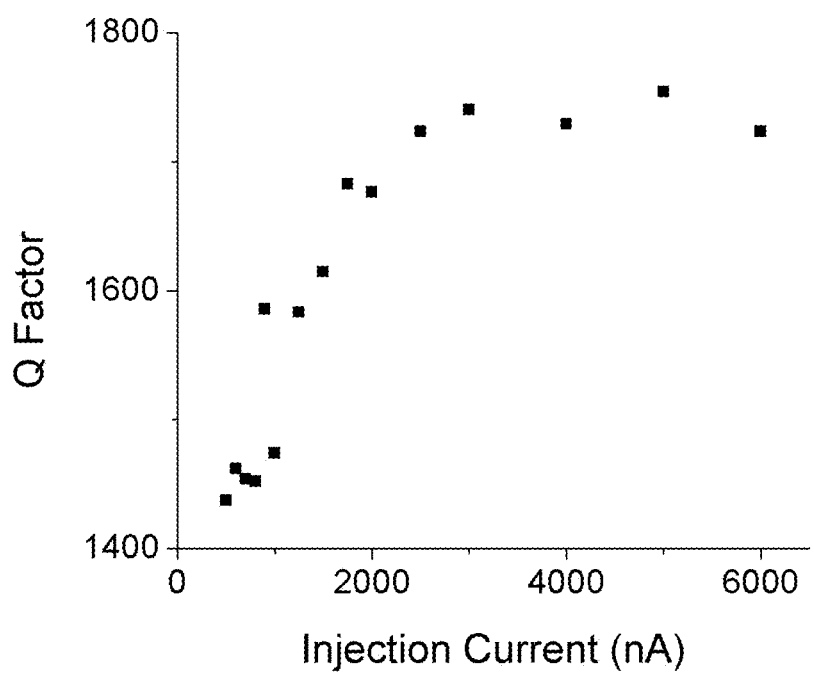

A spectrum of the emission for the LED of FIGS. 9a-d is shown in FIG. 10a at a forward bias current of 10 μA and at room temperature. Bright and clearly defined cavity modes peak well above the background QD emission with the fundamental mode centered at 1,230 nm. As the pump current increases, the intensity of the fundamental mode emission increases superlinearly, as seen on FIG. 10b. Here the triangles are data points for the fundamental cavity mode and the squares are data points for uncoupled background spontaneous emission. However, room temperature lasing can be ruled out because the spontaneous emission (SE) intensity uncoupled to the cavity also follows the same trend, in contrast to lasers at low temperature as described in section A. Possible explanations for the superlinear emission behavior are an increase in QD emission efficiency with increasing carrier density as well as multiexcitonic effects from higher order QD states; considering that the same superlinear emission behavior is observed at all wavelengths, we believe that this is a result of the former effect. The peak wavelength of the cavity mode vs. injection current is shown in FIG. 10*c*, and is first seen to blueshift due to free carrier dispersion before redshifting at high biases. The magnitude of the blueshift ~40 µm corresponds to an injected carrier level of $10^{16}$ cm$^{-3}$, in good agreement with simulations and the slight redshift for higher biases indicates a sample self-heating of at most a few degrees C. FIG. 10*d* shows the cavity quality (Q) factor versus injection current and demonstrates that even at room temperature, a small amount of gain from the quantum dots is observed. The reduction in QD gain at room temperature compared to cryogenic temperatures is ascribed to modified properties of our quantum dots after rapid thermal annealing, described in the next section.

B2b) Lifetime Measurements

In order to better understand the system, we employ a 3-level rate equation model and experimentally measure various lifetime processes. The coupled rate equations are as follows:

$$\frac{dN_B}{dt} = \frac{I}{QV} - \frac{N_B}{\tau_{NR}} - \frac{N_B}{\tau_{SP,B}} - \frac{N_B}{\tau_C} + \frac{N_{QD}}{\tau_E} \quad (1)$$

$$\frac{dN_{QD}}{dt} = \frac{N_B}{\tau_C} - \frac{N_{QD}}{\tau_E} - \frac{F_C N_{QD}}{\tau_{SP,QD}} \quad (2)$$

The free carrier and quantum dot carrier densities are given by $N_B$ and $N_{QD}$, respectively. V is the active pumped volume and q is the electron charge. Free carriers are injected into the upper level through a pump current, I, and then decay either radiatively (rate $1/\tau_{SP,B}$), non-radiatively (rate $1/\tau_{NR}$), or into the quantum dots (rate $1/\tau_C$). The captured carriers in the quantum dots can then either recombine through Purcell-enhanced spontaneous emission at rate $F_C/\tau_{SP,QD}$ (where $F_C$ is the Purcell factor and $1/\tau_{SP,QD}$ is the ordinary SE rate) or be reemitted back into the free carrier upper level at rate $1/\tau_E$. We neglect any stimulated emission term in the rate equations since our diode is non-lasing.

Figure 11A:
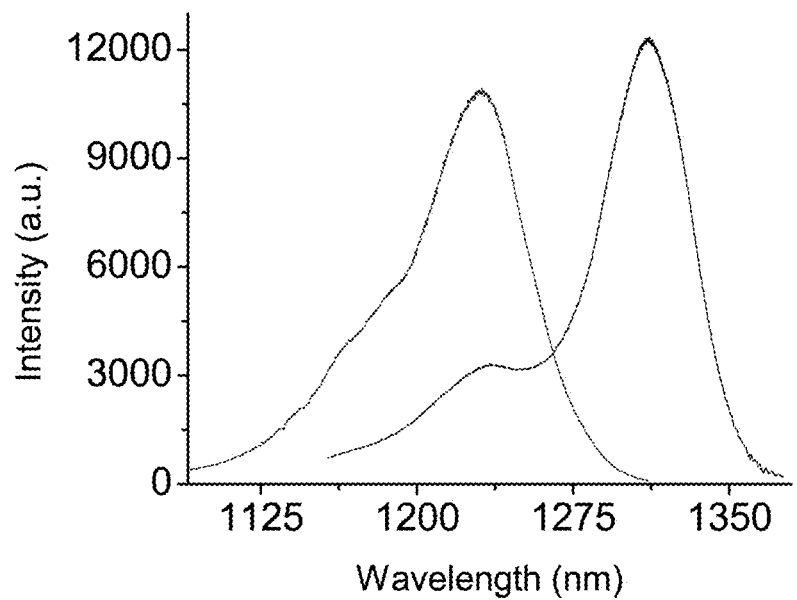
FIGS. 11a-e show optical pumped time-resolved measurements from an annealed sample.

At cryogenic temperatures, the InAs quantum dots have a long (>1 ns) bulk lifetime due to the trapping of carriers inside the QD confining potential (negligible $N_{QD}/\tau_E$ rate). Near room temperature, however, the thermal energy of trapped carriers allows for a non-zero reemission rate (i.e. shorter $\tau_E$) and a lower overall QD lifetime of around 100-300 ps due to bulk non-radiative recombination. In our devices, the quantum dots undergo a rapid thermal annealing step at 850° C. (representative annealing times for this step are in a range from several seconds to several minutes (e.g., between 3 seconds and 5 minutes) in order to activate the nearby implanted dopants. This high temperature step causes the QD ensemble emission to blueshift by 80 nm and spectrally broaden. FIG. 11*a* shows the bulk QD photoluminescence results under continuous wave pumping, where the curve on the right is pre-anneal and the curve on the left is post-anneal. Likely, the QD core intermixes with the wetting layer and there is a narrowing of the overall QD sizes as seen previously. These effects would suggest a shallower confining potential and hence a more rapid reemission of carriers from the quantum dots. If in addition there is fast non-radiative recombination present (i.e., short $\tau_{NR}$ resulting from etched GaAs surfaces), the overall lifetime and emission strength of the quantum dots should be reduced due to thermal escape and quenching.

Figure 11B:
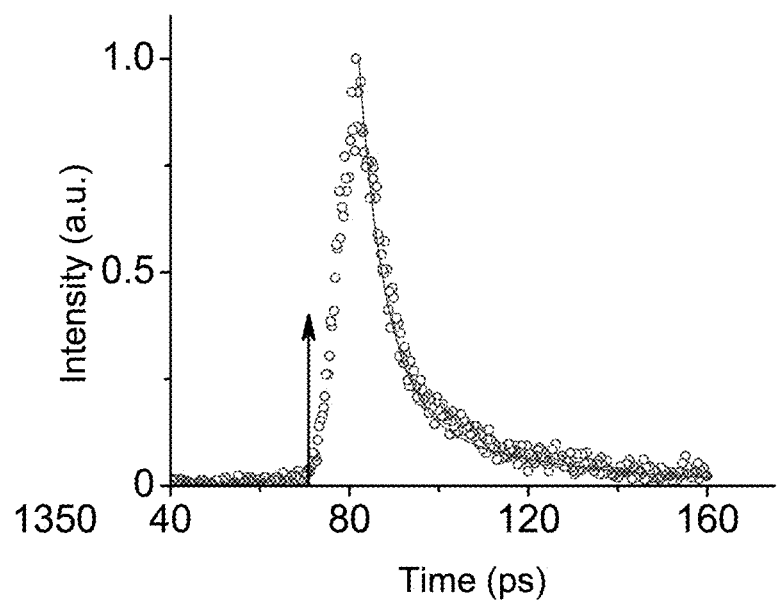
Figure 11C:
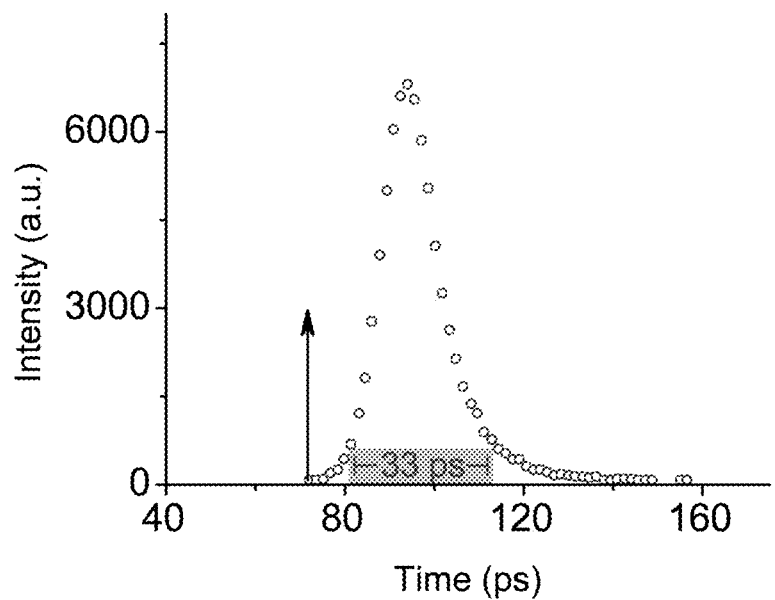
Figure 11D:
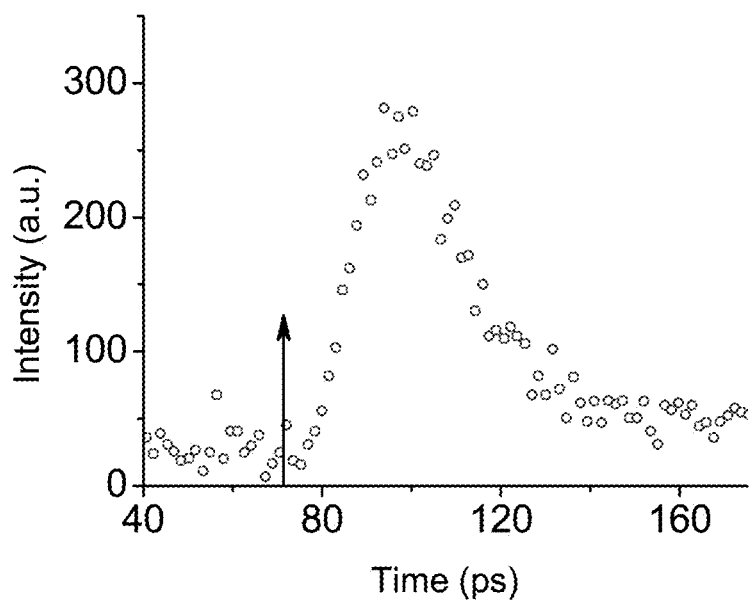
Figure 11E:
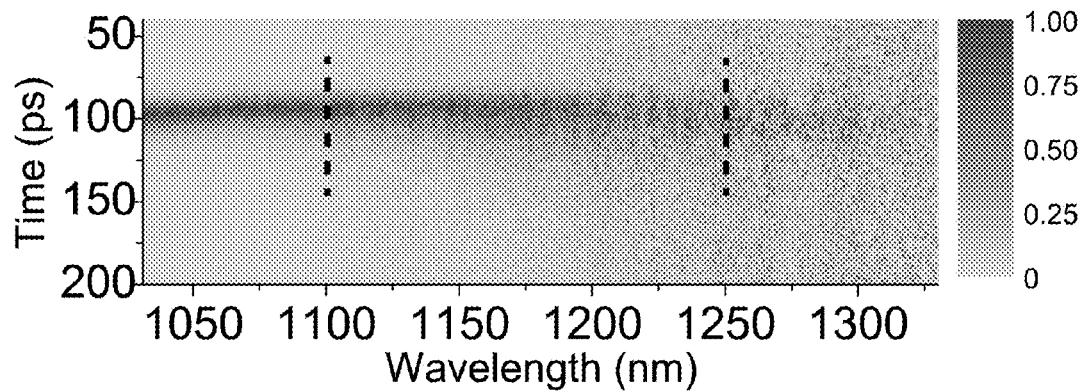

To confirm this hypothesis, we perform time-resolved photoluminescence measurements of our post-annealed sample using a mode-locked Ti:Sapphire laser for excitation and a streak camera with an extended range detector unit. The free carrier non-radiative recombination rate can be measured by examining the behavior of the 870 nm GaAs band edge emission in a photonic crystal region. FIG. 11*b* shows GaAs band edge emission at 870 nm from the photonic crystal region. Here it is seen that the non-radiative lifetime, $\tau_{NR}$, in a PC region is very short at 6 ps due to the presence of many etched-hole surfaces. FIG. 11*c* shows quantum dot lifetime at 1,100 nm under equivalent excitation as in FIG. 11*b*. Here we see the measured QD lifetime is only 10 ps at 1,100 nm, which is far shorter than the 100-300 ps result for pre-annealed samples and thus verifying the rapid carrier escape prediction. This result means that luminescence from quantum dots can effectively be turned off in ~10 ps, with approximately 4 ps attributed to the carrier reemission time ($\tau_E$) and 6 ps to the non-radiative surface recombination. FIG. 11*d* shows quantum dot lifetime at 1,250 nm, exhibiting an 18 ps fall time. FIG. 11*e* shows the spectrum of room temperature lifetime data for the broad range of QD emission wavelengths. To clarify the data due to the poor sensitivity of the detector for longer wavelengths, intensities have been normalized in 3 nm bins. Vertical dashed lines indicate slices from which FIGS. 11*c-d* have been taken. For longer wavelength QDs, the turn-off time slowly increases monotonically with wavelength indicating deeper carrier confinement, as seen on FIGS. 11*d-e*. The QD carrier capture time ($\tau_C$) can be estimated from the leading edge of the QD emission and is 10 ps. Therefore, the QD turn on time is approximately the sum of this term plus the rise time for free carriers (also 6 ps) for a total time of 16 ps. As seen in FIG. 11*c* the time duration for which the QD emission pulse is greater than 10% is only 33 ps. Consequently, our LED is capable of switching speeds of up to 30 GHz.

B2c) Direct Electrical Modulation

Figure 12A:
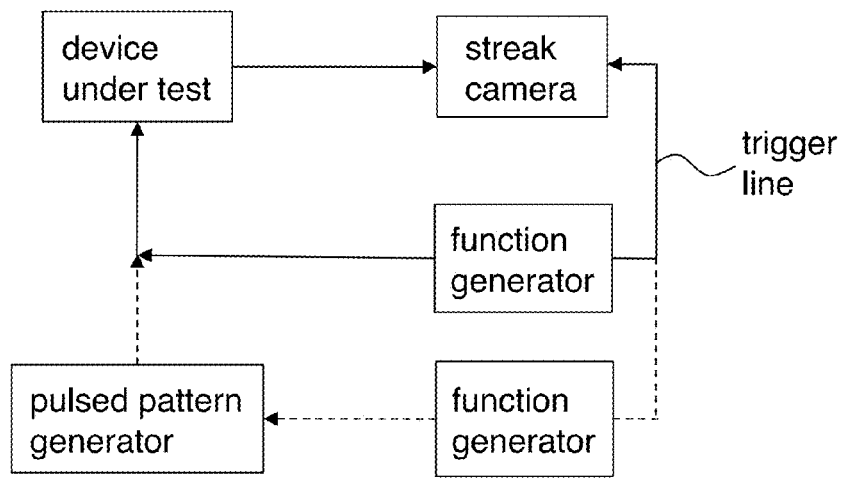
FIG. 12a shows the experimental setup for electrical modulation experiments on single-mode LEDs.
Figure 12B:
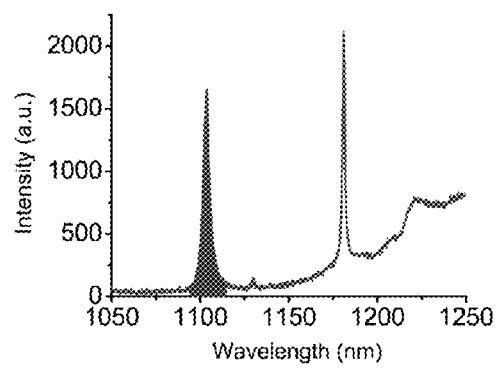
FIGS. 12b-d show modulation results.

We next perform time-resolved direct electrical modulation studies to determine the electrical response of our devices. FIG. 12*a* schematically shows the experimental setup. For a single-pulse time-resolved measurement, only the function generator is used (solid lines), while for multiple pulses a pulsed pattern generator is also used (dashed lines). Since our detector has two orders of magnitude better sensitivity at 1,100 nm compared to the QD peak gain at 1,230 nm, we examine a different cavity than the one relating to FIGS. 10*a-d*. FIG. 12*b* shows the emission spectrum for the cavity used in the direct modulation experiments. The filled in peak is the isolated mode at 1,100 nm. Although this wavelength corresponds to excited states of the quantum dots, the switching lifetimes are still governed by the same rapid carrier escape effects. The only difference between QD transitions at 1,100 nm and 1,230 nm is a shallower carrier confinement at shorter wavelength and therefore slightly faster turn-off time. As seen on FIG. 12*b*, this cavity has a bright higher order mode at 1,100 nm despite the low background QD emission in that spectral region. The Q factor for this mode is lower than for the fundamental mode and is measured to be 250. Similar to the cavity mode of FIGS. 10*a-d*, the mode at 1,100 nm also exhibits a superlinear pump power dependence and minor linewidth narrowing. The experimental setup includes the same streak camera detector as before; however, instead of an 80 MHz optical pump we use an 80 MHz electrical pulse generator to drive the LED directly, as shown on FIG. 12*a*. For single-shot measurements we use only a regular function generator while for pulse train measurements a pulse pattern generator is used in conjunction with the first function generator. To ensure proper signal referencing of the LED and detector, the two electrical sources are clocked together, as described below (Methods section).

Figure 12C:
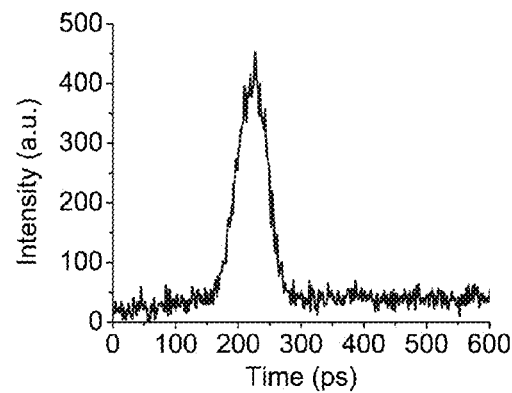
Figure 12D:
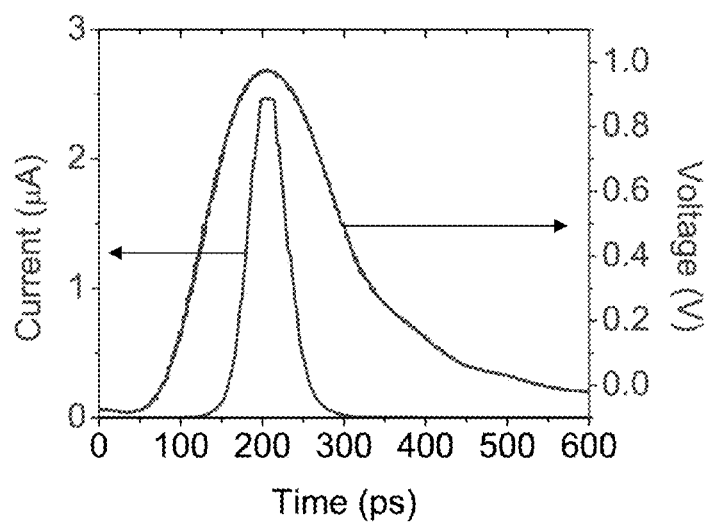

In FIG. 12c we see the ultrafast response of our LED when a short electrical pulse is applied. FIG. 12d shows the corresponding driving voltage and current pulses. Although the voltage pulse has a full width at half maximum (FWHM) of over 200 ps, the injected current is highly nonlinear with voltage and hence the pump current pulse is quite narrow at 60 ps FWHM. The resultant single mode diode response tracks the current pulse nicely after an initial turn on delay. This result demonstrates that our single mode LED device is indeed capable of ultra-fast electrical switching at many GHz speed. The entire pulse duration (the time above 10% of the peak height) is less than 100 ps and therefore the LED switching speed for a non-return-to-zero signal is approximately 10 GHz. Compared to previously shown directly modulated photonic crystal single-mode LEDs at cryogenic temperatures, this speed is over an order of magnitude faster with three orders of magnitude lower power consumption (here only 2.5 µW). It is interesting to note that the photonic crystal RC time constant does not impact the diode response at these speeds due to the incredibly small capacitance of the p-i-n junction. For this particular cavity at room temperature we do not quantitatively observe Purcell enhancement due to the dominant carrier escape rate over the spontaneous emission rate.

Figure 13A:
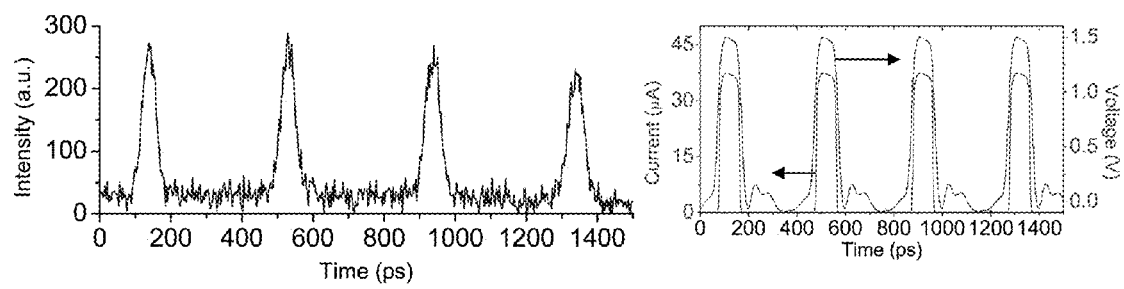
FIGS. 13a-b show further experimental modulation results.
Figure 13B:
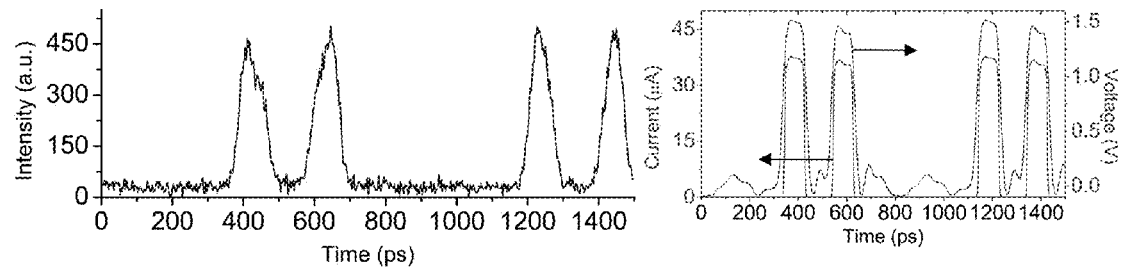

Next we directly modulate our diode with a pulse train to observe dynamic behavior with a multiple bit sequence. To do this, a programmed bit stream from a pulsed pattern generator is applied to the LED while the other function generator sends a triggering signal to the streak camera (see Methods section below). FIGS. 13a-b show the light output (on the left) for two different bit sequences, along with corresponding pump signal data (on the right). The diode replicates the bit sequences well and behaves very much like the single-shot measurement above. On-pulses are still about 100 ps wide and the bit stream has clearly resolvable off-pulse sections. Fast electrical data is thereby effectively mapped onto the single mode carrier of the nanocavity LED, which can be used as the light source for an optical interconnect link.

B3) Discussion

The results presented here show for the first time GHz speed direct electrical modulation of a single mode LED at ultra-low energies. In fact, the measured power consumption for the 10 GHz pulse in FIG. 12c is only 2.5 µW, indicating an average energy per bit of only 0.25 fJ. This exceptionally low value indicates significant improvement over the standard approach of using slow, high threshold lasers and external modulator components. For example, typical 'low' power ring-based modulators require an average energy per bit of ~500 fJ while MZI modulators have pJ switching energies. Information can just as easily be communicated over a directly modulated low power source, skipping the external modulator altogether. Furthermore, chirp is a non-issue for a directly modulated LED interconnect since optical interconnect distances are so short that dispersion of pulse data can be neglected. This new paradigm of replacing traditional power hungry lasers and modulators with ultrafast nanocavity light sources could allow optical interconnects to meet the energy targets needed for wide scale adoption.

Our PC LED has one of the fastest switching speeds ever demonstrated for an LED device, either low power and single mode or high power and multimode. Other researchers have previously demonstrated a record LED −3 dB cutoff speed at 7 GHz using a bipolar junction to sweep away carriers that do not recombine fast enough. While we don't explicitly measure a −3 dB point, a single-pole analysis of the 10 ps turn-off time found above for QDs at 1,100 nm suggests a very large −3 dB bandwidth of 16 GHz. The single mode operation of our diode at low power, however, is far more attractive for on-chip communications than the previously demonstrated high speed LED.

We find the output power for our device to be 10 s to 100 s of pW at µW bias levels, indicating an efficiency of $\sim 10^{-5}$. This result is not surprising given the fact that the majority of carrier recombination is non-radiative and not through QD emission. Nonetheless, such low power signals can be detected using advanced photodetector technologies. For example, various nanoscale avalanche photodiodes have been demonstrated in different material systems that can effectively detect low level (even sub-pW) signals. Another promising strategy for improving the responsivity of near-IR photodetectors is via plasmonic concentration of light with resonant antennas or metallic structures.

It has been proposed that single mode LEDs can have very high modulation bandwidths under situations where the spontaneous emission rate is increased through Purcell enhancement alone. In this scenario, quantum efficiencies could be made higher since the predominant recombination process is radiative. Meanwhile, the modulation bandwidth is boosted by the ability to speed up LED spontaneous emission through cavity enhancement. We examined the tested device from FIG. 12c at 10K temperature and performed time-resolved studies on the quantum dot emission lifetimes. We find that the cavity emission lifetime at 1,100 nm is decreased threefold compared to uncoupled QD emission, corresponding to a Purcell factor of 5.5. Therefore, our device could utilize Purcell enhancement for fast switching at cryogenic temperatures where carrier escape and non-radiative recombination effects are minimized. In contrast, at room temperature, thermal excitation of carriers depopulates the quantum dots much quicker than does Purcell enhanced spontaneous emission, and modulation time is thus limited by non-radiative effects, as a result of material issues. Our other experimental studies reflect this conclusion, since QD emission off-resonant with the cavity mode is seen to decay just as quickly as does on-resonant emission. This limitation is a fundamental material constraint for these types of quantum dots inside GaAs and is not due to our fabrication process or device design. We believe that fast switching realized by Purcell enhancement alone could be accomplished by shutting down non-radiative recombination completely, which would require using quantum dots with deeper confining potentials, combined with sophisticated surface passivation techniques, or use of a different material system (such as InP-based) with lower surface recombination rates. We emphasize that despite the device speed not being Purcell factor limited, the presence of the nano-cavity in our LED has several major benefits, including the improvement of the device efficiency (increased light emission into the cavity mode and channeling of photons in the desired, collection direction), the reduction in the modulation energy per bit, and single mode operation, which is important for optical interconnect applications.

In summary we have demonstrated an ultrafast single mode nanocavity LED operating at room temperature with 10 GHz large signal direct modulation speed. A lateral p-i-n photonic crystal diode provides extremely low modulation energies of fJ/bit, and can be readily applied to other III-V materials with different gain media and surface properties, leading to a large range of possible device characteristics. The low energy per bit of these optical sources makes them promising for future energy efficient optical interconnect applications.

B4) Methods

B4a) Fabrication

Devices were fabricated using the process of section A above, with the exception that the thermal oxidation was increased to 15 minutes to complete the sacrificial layer oxidation. Cavities were fabricated to have a range of lattice constants, a=300-340 nm, and hole radii, r/a=0.2-0.25. The devices tested had a=330 nm and r=65 nm.

B4b) Optical Testing

Samples were mounted on a stage at room temperature and contacted directly by low-speed electrical probes. A source meter with sub-nano-amp accuracy was used to drive devices. Emission was collected by a 0.5 NA objective lens and directed toward a spectrometer with a liquid-nitrogen-cooled InGaAs charge-coupled device detector. Cryogenic testing was performed by mounting samples inside a helium-flow cryostat.

B4c) High-Speed Measurements

Time resolved optical testing was performed using an 80 MHz Ti:Sapphire laser generating 3 ps width pulses. The samples were mounted and the collected photoluminescence was detected by a Hamamatsu C5680 streak camera with 2 ps resolution. For time resolved electrical measurements, the devices were contacted by high-speed probes having a 40 GHz cutoff frequency. An Agilent 8133A function generator was used to drive both the LED device and streak camera at 80 MHz for single pulse measurements. To perform pulse train experiments, an Anritsu MP1800A pulse pattern generator was used to program a bit pattern that was sent to the LED device. This pattern length had a repetition rate faster than the 80 MHz required by the streak camera for locking. It was sent to the Agilent function generator where it was divided by an integer number such that the repetition rate of the new signal was close to 80 MHz. This new signal provided the proper trigger for the streak camera and was clocked correctly with the original drive signal.

The invention claimed is:

1. A light emitting diode comprising:
an optical resonator disposed in a layer of a direct-gap semiconducting material;
a 2-D photonic crystal structure disposed in said layer around said optical resonator, wherein optical confinement for said resonator in a plane of said layer is provided by said 2-D photonic crystal structure; and
a lateral P-I-N structure formed in said layer such that said optical resonator is included in an intrinsic region (I-region) and such that said optical resonator is adjacent to a p-type region and is adjacent to an n-type region;
wherein said I-region includes a focus zone having width substantially less than other zones of said I-region, and wherein said optical resonator is disposed in said focus zone of said I-region.

2. The light emitting diode of claim 1, wherein said focus zone has a width of ¼ or less of a nominal width of said other zones of said I-region.

3. The light emitting diode of claim 1, wherein I-region current flow in said lateral P-I-N structure is substantially restricted to said focus zone.

4. The light emitting diode of claim 1, wherein said focus zone and said optical resonator have substantially the same lateral dimensions.

5. The light emitting diode of claim 1, wherein said 2-D photonic crystal comprises a regular array of holes in said layer, and wherein said optical resonator comprises a defect of one or more linearly adjacent missing holes of said array.

6. The light emitting diode of claim 1, wherein said optical resonator includes one or more quantum wells, quantum wires, and/or quantum dots.

7. The light emitting diode of claim 1, wherein said 2-D photonic crystal structure comprises one or more optical waveguides to provide in-plane optical coupling to said resonator.

8. The light emitting diode of claim 1, further comprising a gain medium disposed in the optical resonator, and wherein a carrier lifetime in the optical resonator is at least 10× less than a spontaneous radiative lifetime of the gain medium.

9. The light emitting diode of claim 8, wherein said focus zone has a width of ¼ or less of a nominal width of said other zones of said I-region.

10. The light emitting diode of claim 8, wherein I-region current flow in said lateral P-I-N structure is substantially restricted to said focus zone.

11. The light emitting diode of claim 8, wherein said focus zone and said optical resonator have substantially the same lateral dimensions.

12. A light emitting diode comprising:
an optical resonator disposed in a layer of a direct-gap semiconducting material;
a 2-D photonic crystal structure disposed in said layer around said optical resonator, wherein optical confinement for said resonator in a plane of said layer is provided by said 2-D photonic crystal structure; and
a lateral P-I-N structure formed in said layer such that said optical resonator is included in an intrinsic region and such that said optical resonator is adjacent to a p-type region and is adjacent to an n-type region;
further comprising a gain medium disposed in the optical resonator, and wherein a carrier lifetime in the optical resonator is at least 10× less than a spontaneous radiative lifetime of the gain medium.

13. The light emitting diode of claim 12, wherein said 2-D photonic crystal comprises a regular array of holes in said layer, and wherein said optical resonator comprises a defect of one or more linearly adjacent missing holes of said array.

14. The light emitting diode of claim 12, wherein said optical resonator includes one or more quantum wells, quantum wires, and/or quantum dots.

15. The light emitting diode of claim 12, wherein said 2-D photonic crystal structure comprises one or more optical waveguides to provide in-plane optical coupling to said resonator.

* * * * *